United States Patent [19]
Bland et al.

[11] Patent Number: 5,177,666
[45] Date of Patent: Jan. 5, 1993

[54] COOLING RACK FOR ELECTRONIC DEVICES

[76] Inventors: Timothy J. Bland, 819 Coolidge Pl., Rockford, Ill. 61107; Michael P. Ciaccio, 7581 Owl Trail, Rockford, Ill. 61111; R. Scott Downing, 2367 Johnquil Pl., Rockford, Ill. 61107

[21] Appl. No.: 781,886
[22] Filed: Oct. 24, 1991
[51] Int. Cl.$^5$ ............................................. H05K 7/20
[52] U.S. Cl. ................... 361/382; 62/259.2; 62/515; 165/104.33; 361/385; 361/407
[58] Field of Search .................. 62/259.2, 515; 165/80.4, 104.33; 357/82; 439/485; 361/382, 403, 383, 407, 385–388, 415, 414; 174/15.1

[56] References Cited

U.S. PATENT DOCUMENTS

| | | | |
|---|---|---|---|
| 3,993,123 | 11/1976 | Chu et al. | 165/80 |
| 4,493,010 | 11/1985 | Morrison | 361/385 |
| 4,619,316 | 10/1986 | Nakayama et al. | 165/104 |
| 4,652,970 | 3/1987 | Wateri et al. | 361/385 |
| 4,712,158 | 12/1987 | Kikuchi et al. | 361/385 |
| 4,750,086 | 6/1988 | Mittal | 361/382 |
| 4,758,926 | 7/1988 | Herrell et al. | 361/385 |
| 4,931,905 | 6/1990 | Cirrito | 361/385 |
| 4,956,746 | 9/1990 | Gates, Jr. | 361/385 |
| 4,962,444 | 10/1990 | Niggemann | 361/382 |
| 5,057,968 | 10/1991 | Morrison | 361/385 |
| 5,079,619 | 1/1992 | Davidson | 357/81 |

FOREIGN PATENT DOCUMENTS 2359148  2/1973  Fed. Rep. of Germany .

OTHER PUBLICATIONS

"Military & Aerospace Electronics ™" article, Jan. 1991, vol. 2, No. 1.

Primary Examiner—Gerald P. Tolin
Attorney, Agent, or Firm—Marshall, O'Toole, Gerstein, Murray & Bicknell

[57] ABSTRACT

A cooling rack is provided for cooperating with a chassis, the chassis having both electrical and fluid connectors, the fluid connectors being interconnected by a manifold for distributing cooling fluid to and from the rack, the rack having a cooling support including at least one electrical component cooling pad, a rack manifold for circulating cooling fluid to the cooling pad, a rack electrical connector, a rack inlet fluid connector in fluid communication with the rack manifold for receiving cooling fluid from the chassis to be circulated through the rack manifold for cooling the cooling pad, and a rack outlet fluid connector in fluid communication with the rack manifold for returning cooling fluid from the rack manifold to the chassis so that the cooling fluid can be recooled, wherein the rack electrical connectors, the rack inlet fluid connector, and the rack outlet fluid connector are arranged so that, when the cooling rack is attached to the chassis, the rack electrical connector, the rack inlet fluid connector, and the rack outlet fluid connector will mate generally in unison with the respective chassis electrical connector and chassis fluid connectors.

18 Claims, 12 Drawing Sheets

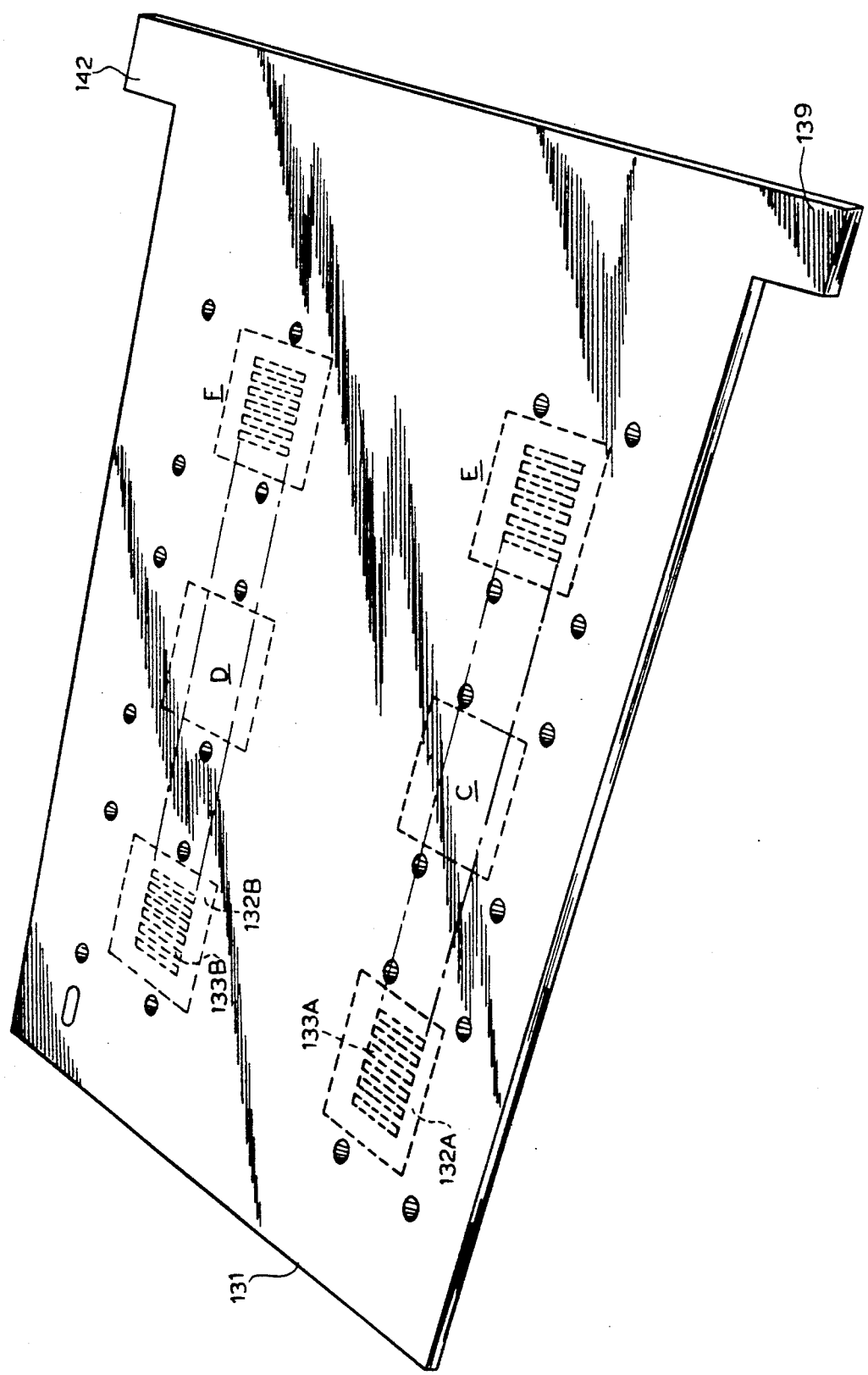

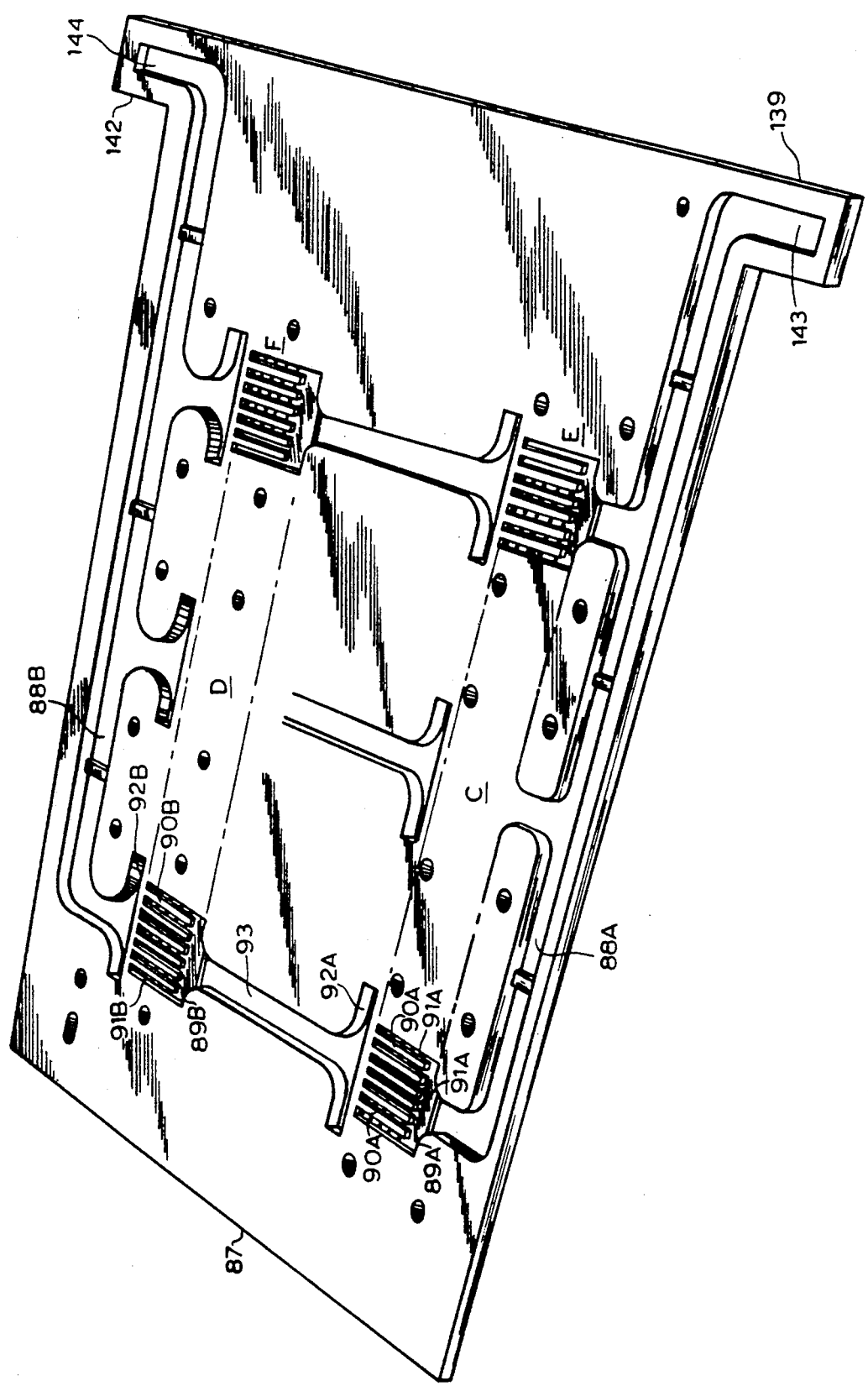

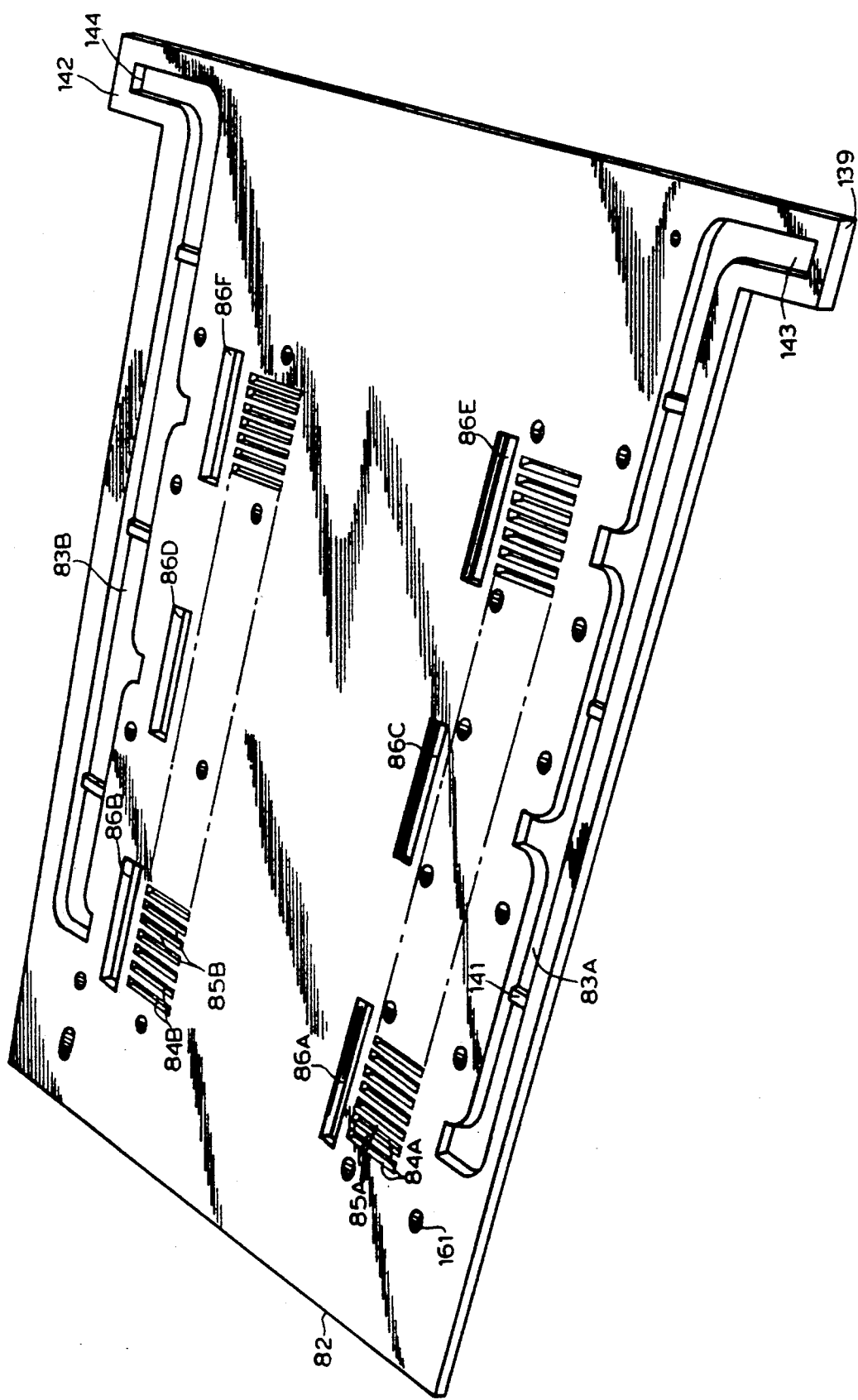

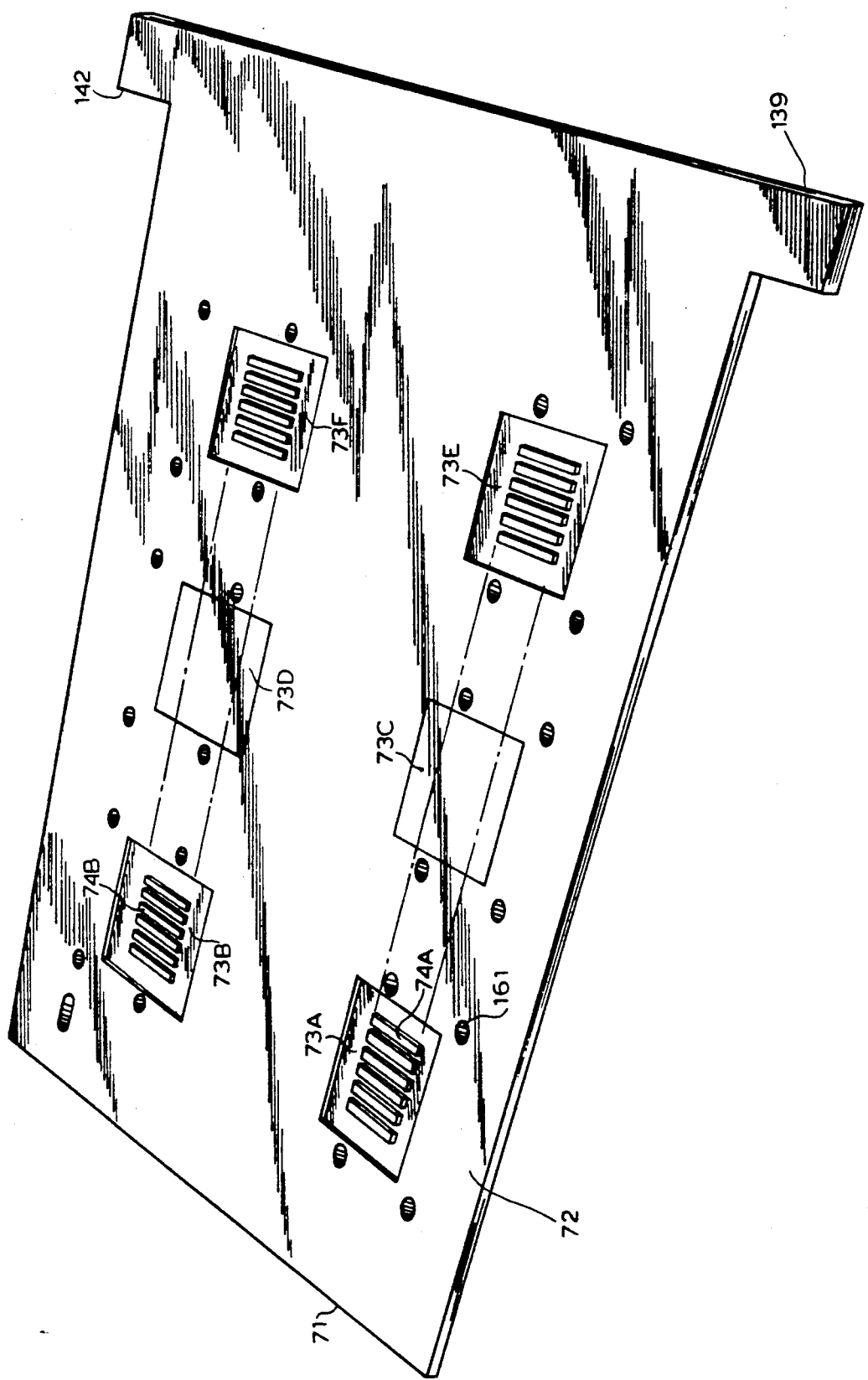

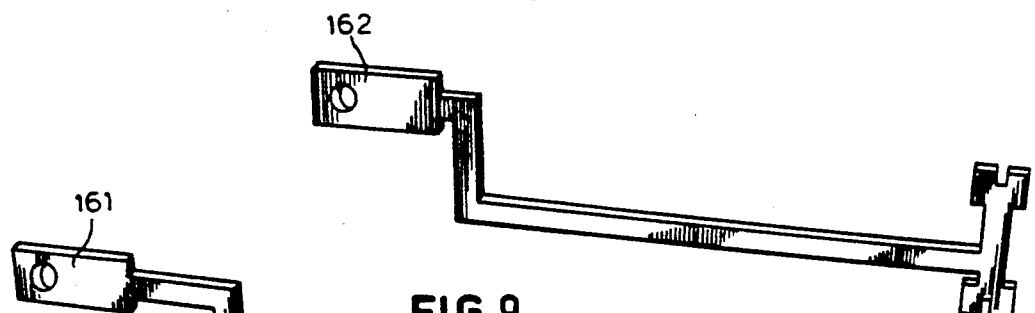
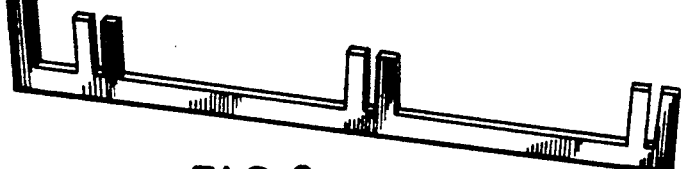
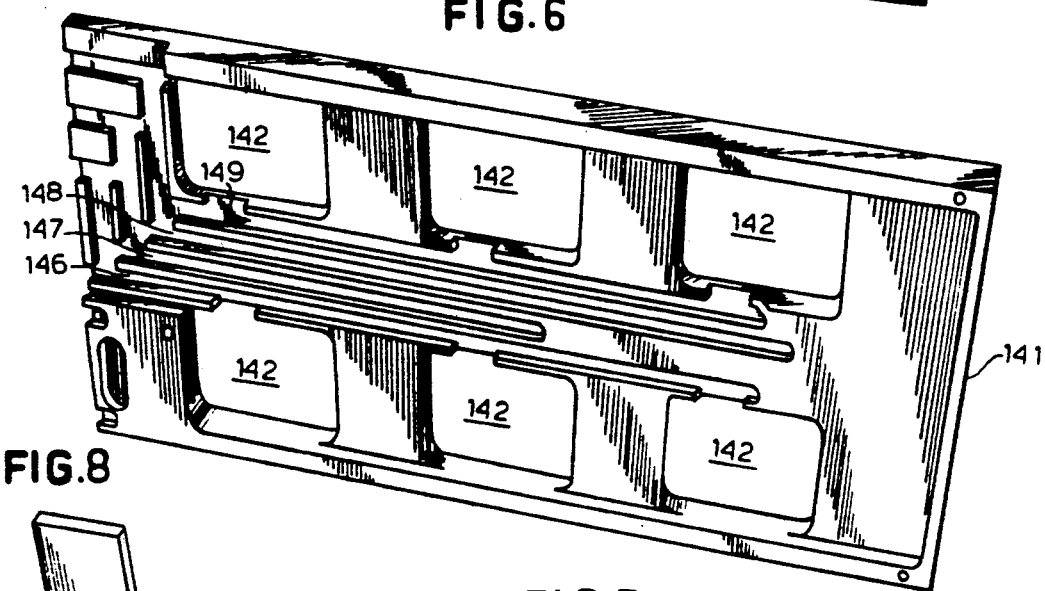
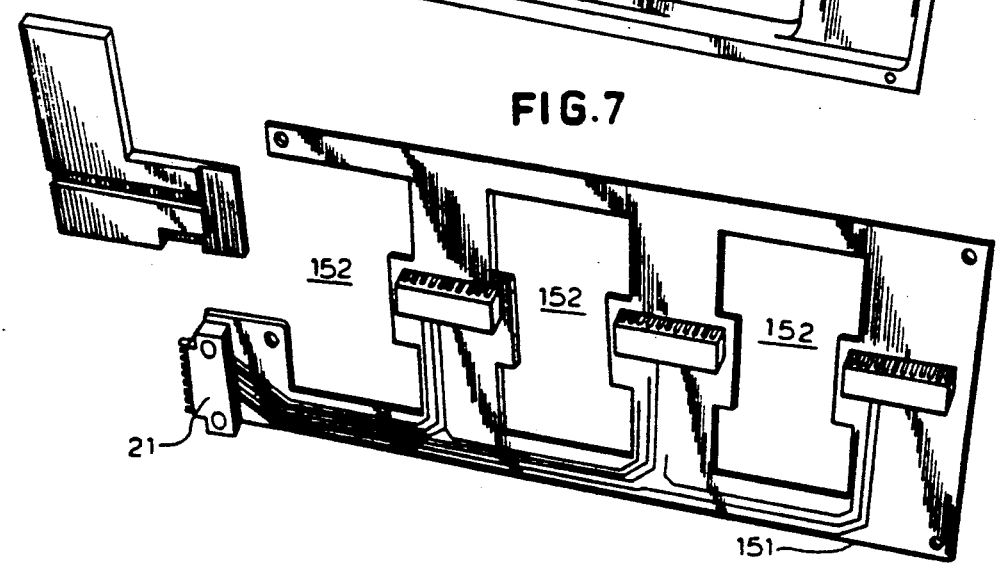

COOLING RACK FOR ELECTRONIC DEVICES

BACKGROUND OF THE INVENTION

The present invention relates to a cooling rack for cooling electronic devices and, more particularly, to a cooling rack having both fluid connectors and electrical connectors so that, as the cooling rack is attached to a chassis, the fluid connectors and electrical connectors of the rack will mate generally in unison with corresponding electrical connectors and fluid connectors on the chassis.

Electronic integrated circuits are used in a wide variety of data processing applications. These integrated circuits usually generate small amounts of power on the order of 1-5 watts and generally operate at temperatures less than 80° C. In some applications, power devices such as insulated gate bipolar transistors are used in conjunction with integrated circuit packages. These power devices can consume power on the order of several hundred watts and can generate temperatures well in excess of those generated by integrated circuit packages. Cooling arrangements must be provided to insure that the high temperatures generated by the power devices do not damage the integrated circuit packages.

Prior cooling arrangements did not lend themselves to high-density electronic arrangements because the fluid connections and manifolds for circulating the cooling fluid to the various integrated circuits and/or power devices consumed large amounts of space. Space is often at a premium in many applications such as those on aircraft. Avionics packages must be compact in size in order to maximize passenger space within an aircraft and must be light weight so that more passenger weight can be carried by the aircraft.

The typical avionics electronic instrumentality comprises a chassis or housing having a mother board and a series of printed circuit boards arranged to plug into the mother board in or on the chassis. The printed circuit boards typically carry integrated circuit packages and, in some cases, power electronic devices. A cooling mechanism must be provided for the integrated circuit packages and any power devices which may be used in conjunction with the integrated circuit packages. The cooling mechanism must be compact in order to minimize the required space and must allow for easy installation and removal of the printed circuit boards in or on the chassis.

SUMMARY OF THE INVENTION

Accordingly, a cooling rack is provided for cooperating with a chassis, the chassis having both electrical and fluid connectors, the fluid connectors being interconnected by a manifold for distributing cooling fluid to and from the rack, the rack having a cooling support including at least one electrical component cooling pad, a rack manifold for circulating cooling fluid to the cooling pad, a rack electrical connector, a rack inlet fluid connector in fluid communication with the rack manifold for receiving cooling fluid from the chassis to be circulated through the rack manifold for cooling the cooling pad, and a rack outlet fluid connector in fluid communication with the rack manifold for returning cooling fluid from the rack manifold to the chassis so that the cooling fluid can be recooled, wherein the rack electrical connectors, the rack inlet fluid connector, and the rack outlet fluid connector are arranged so that, when the cooling rack is attached to the chassis, the rack electrical connector, the rack inlet fluid connector, and the rack outlet fluid connector will mate generally in unison with the respective chassis electrical connector and chassis fluid connectors.

The cooling rack can be configured to provide electrical component cooling pads on two opposing sides thereof. The cooling rack can be further refined to carry printed circuit boards on board supports which board supports are mounted to the cooling support of the rack. The printed circuit board and the board support can have openings corresponding with the electrical component cooling pads such that as the board support is suitably affixed to the cooling support of the rack, the electrical components can also be suitably attached directly to the electrical component cooling pads and then electrically connected to the rack electrical connectors.

BRIEF DESCRIPTION OF THE DRAWINGS

These and other features and advantages will become more apparent from a detailed consideration of the invention when taken in conjunction with the drawings in which:

FIGS. 5A-5H show the rack fluid manifold and cooling pads in more detail;

FIG. 6 shows a board support for mounting to the rack cooling support and cooling pads shown in FIG. 5;

FIG. 7 shows a printed circuit board which may be mounted to the board support shown in FIG. 6;

FIG. 8 shows a bus bar support which may be used in conjunction with the board support shown in FIG. 6;

FIGS. 9 and 10 show two forms of bus bars which can be used on the board support in FIG. 6 and which cooperate with the electrical components such as the one shown in FIG. 2; and, FIG. 11 shows the cooperation between the cooling rack and the chassis.

DETAILED DESCRIPTION

Figure 1:
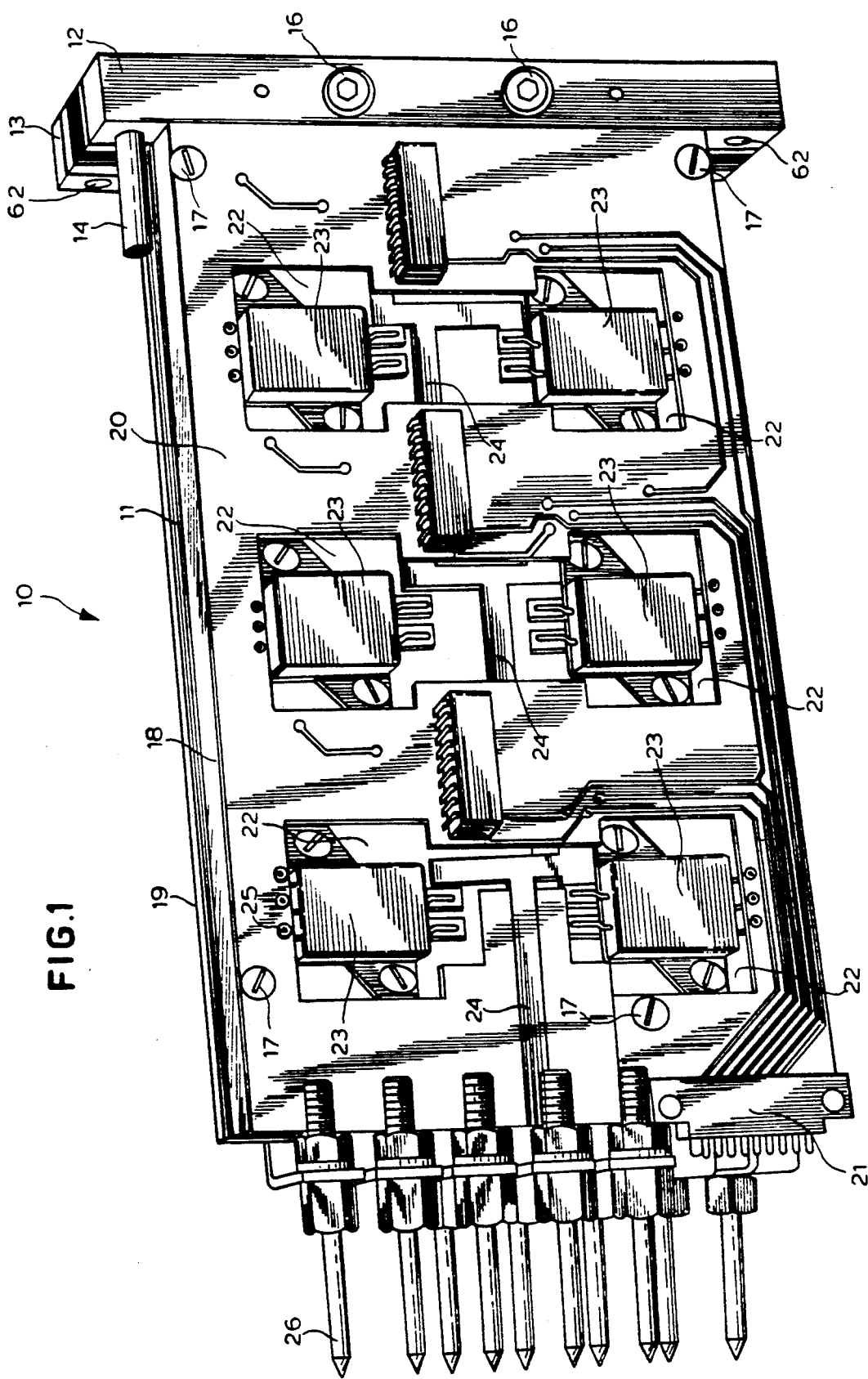
FIG. 1 is a perspective of a cooling rack having printed circuit boards and electrical components mounted thereto.

As shown in FIG. 1, rack 10 comprises cooling support 11 which will be shown in more detail in connection with FIGS. 5A-5H. Rack 10 has a pair of fluid connector manifolds 12 and 13 for supporting rack fluid inlet connector 14 and rack fluid outlet connector 15 (FIG. 11) respectively. A gasket (not shown) may be included between cooling support 11 and each of the connector manifolds 12 and 13 for sealing cooling fluid therein. Connector manifolds 12 and 13 may be suitably attached to cooling support 11 by way of fastening devices 16.

Mounted on each side of cooling support 11 are board supports 18 and 19. Printed circuit boards 20 can be mounted to each of the board supports 18 and 19 by suitable fastening means 17. The printed circuit board may have circuit paths deposited thereon for interconnecting various integrated circuit packages and electrical components. The circuits paths are connected to an electrical connector 21 which will engage a corresponding electrical connector in the chassis or housing. Board supports 18 and 19, and printed circuit boards 20, have corresponding openings 22 for receiving electronic components or power devices such as insulated gate bipolar transistors 23 in each of the openings for direct mounting to cooling support 11. Cooling pads are provided on the cooling support 11 in order to cool electrical components 23. Power bus bars 24 are supported by board supports 18 and 19 for carrying high-level power to and from power devices 23. Power devices 23 can be connected such as at 25 to the circuit paths carried by printed circuit boards 20 connectable to electrical connector 21. Power connectors 26 are suitably attached to the power bus bars and have corresponding connectors on the chassis.

As explained in more detail hereinafter, fluid inlet 14 is connected through connector manifold 12 to the rack manifold of cooling support 11 which receives cooling fluid from the chassis and circulates the cooling fluid to the various electrical component cooling pads which support electrical components such as power devices 23. The rack manifold returns fluid through connector manifold 13 to outlet connector 15 which returns fluid to the chassis.

Figure 2:
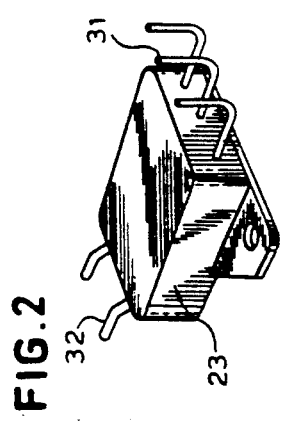
FIG. 2 is one of the electrical components for mounting through a suitable opening in the printed circuit board to a cooling pad on the rack.

The power device 23 as shown in FIG. 2 has pin connectors 31 which are bent in order to engage suitable holes on printed circuit boards 20 from the underneath side and so that power device 23 can then be pivoted about pin connectors 31 to mount flush against its corresponding electrical component cooling pad on cooling support 11. As power device 23 is pivoted, power tabs 32 engage corresponding bus bars 24.

Figure 4:
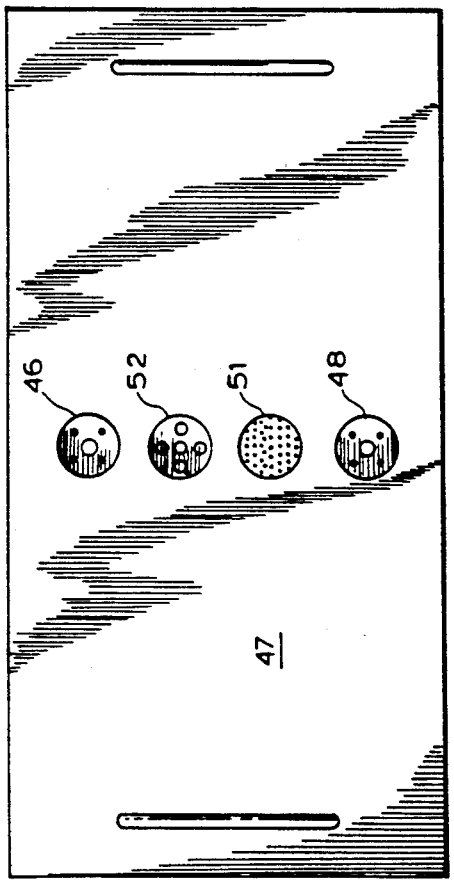
FIG. 4 is a side view of the chassis of FIG. 3 showing fluid and electrical inlet and outlet connectors thereon.
Figure 3:
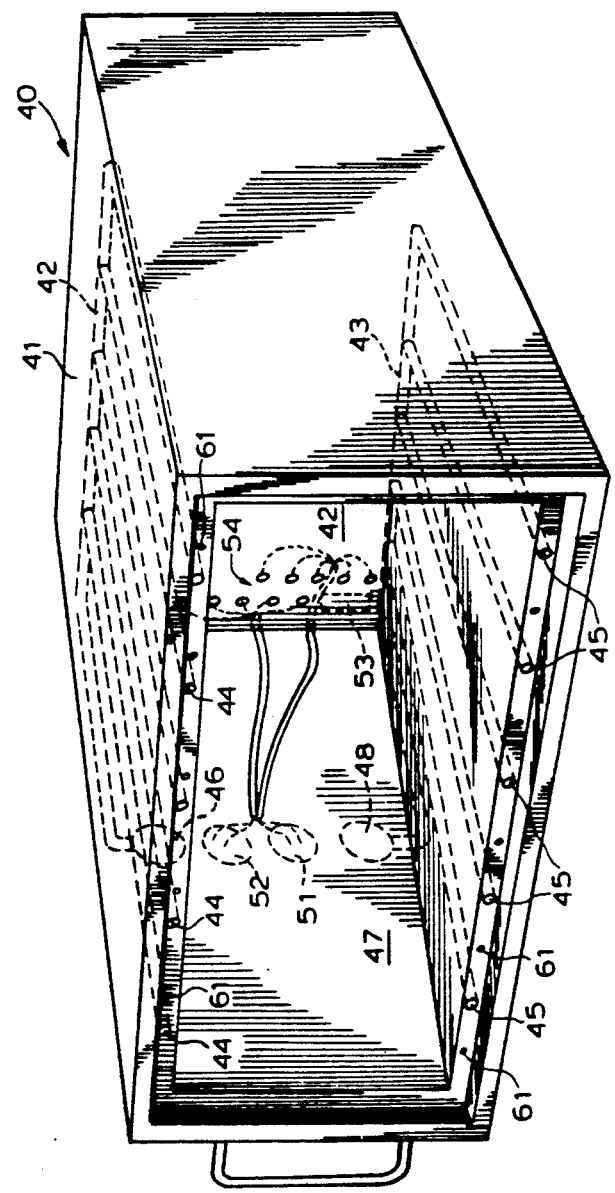
FIG. 3 is a perspective view of a chassis for receiving a plurality of cooling racks such as the one shown in FIG. 1.

Chassis 40 for receiving cooling rack 10 is shown in FIGS. 3 and 4. Chassis 40 includes housing 41 having mother board 42 supported by a backface thereof and further includes inlet manifold 42 and outlet manifold 43 within the respective top and bottom of housing 41. Inlet manifold 42 is in fluid communication with a plurality of connectors 44 for delivering cooling fluid to respective rack fluid inlet connectors 14 of the cooling racks. Manifold 43 is connected to a plurality of fluid connectors 45 for receiving back cooling fluid from connectors 15 of cooling racks 11. Manifold 42 is connected to fluid inlet 46 on side 47 of housing 41 as shown in FIG. 4. Manifold 43 is connected to fluid outlet 48 on side 47. Side 47 of housing 41 also carries low amp connector 51 and high amp connector 52 which are suitably connected to chassis low amp connector 53 and high amp connectors 54 mounted to mother board 42.

Accordingly, as rack 10 is attached to or inserted in chassis 40, rack fluid connector 14 will engage, in fluid communication, chassis fluid connector 44, rack fluid connector 15 will engage, in fluid communication, chassis fluid connector 45, rack low amp connector 21 will electrically engage low amp connector 53, and power connectors 26 of rack 10 will electrically engage power connectors 54. All of these connections are made generally in unison as rack 10 is connected to chassis 40 for ease of rack 10 insertion and removal. These connections are in the nature of quick connections.

Cooling fluid then flows from a cooling source through connector 46 and is distributed to the various chassis fluid connectors 44 by manifold 42 for delivery to corresponding racks 10. The cooling fluid then circulates through the racks for cooling the electrical component cooling pads and are returned through connectors 15 to chassis connectors 45. The cooling fluid then is delivered back by way of manifold 43 to fluid outlet 48 for return to the cooling mechanism which will then recool the cooling fluid and redeliver the cooling fluid to inlet 46. Chassis 40 may be provided with a plurality of receptacles 61 for receiving suitable fastening means for fastening racks 11 to chassis 40 by way of corresponding holes 62 on connector manifolds 12 and 13.

Cooling support 11 is shown in more detail in FIGS. 5A–5H. Cooling support 11 is assembled using a plurality of plates, such as aluminum plates, suitably formed, as by etching or stamping, to provide the rack manifold which receives fluid from connector manifold 12 for delivery of cooling fluid to electrical component cooling pads for cooling power devices 23 as shown in FIG. 1. Cooling rack 11 comprises eight such plates which are sandwiched together between connector manifolds 12 and 13 and board supports 18 and 19, all of which are secured by fastening devices 16 and 17.

Cooling rack 11 has plate 71, FIG. 5H, which provides first surface 72 having electrical component cooling pad 73A formed therein. Cooling pad 73A is formed by a depression in plate 71 and does not extend all the way through plate 71. Cooling pad 73A forms a thin cooling pad. An electrical component such as power device 23 may be mounted on the underside of pad 73A, as viewed in FIG. 5H, to be cooled thereby. Plate 71 has six such pads, although any suitable number can be provided. Pad 73A has mesas 74A for insuring that fluid is thoroughly swirled through pad 73A and for providing extra support for the electrical components mounted thereto. Plate 71 has similar pad areas B, C, D, E and F.

Figure 5B:
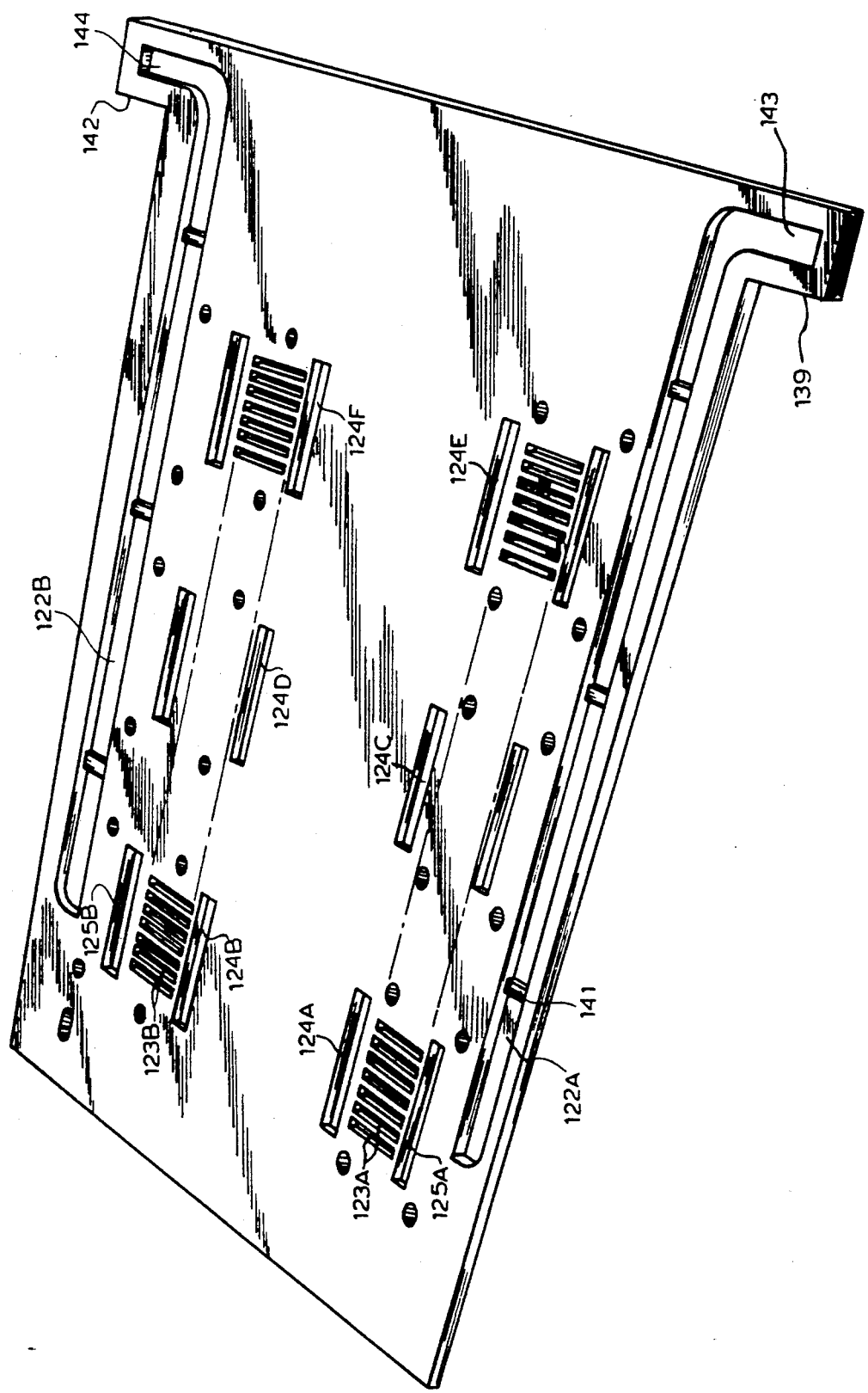
Figure 5C:
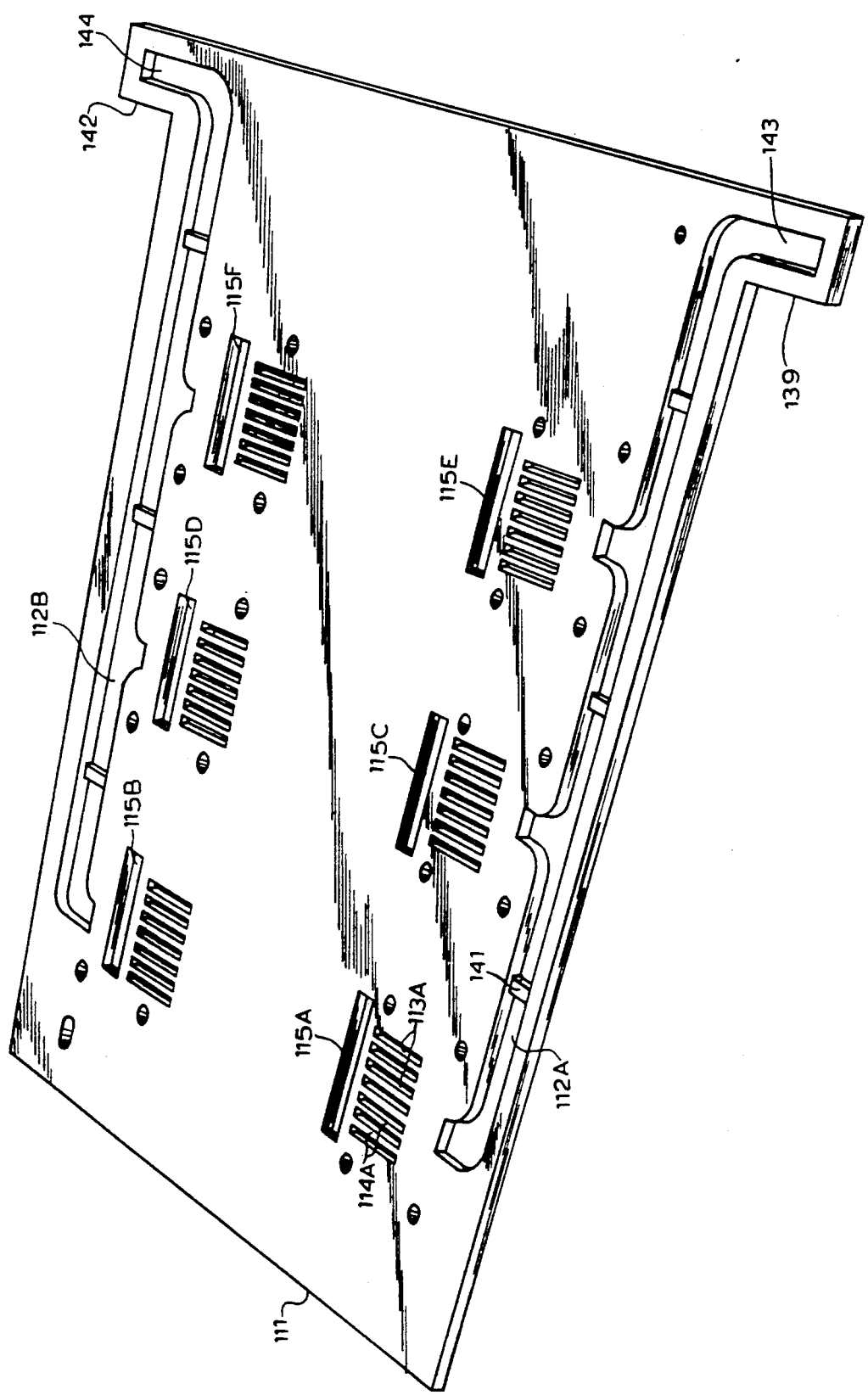
Figure 5D:
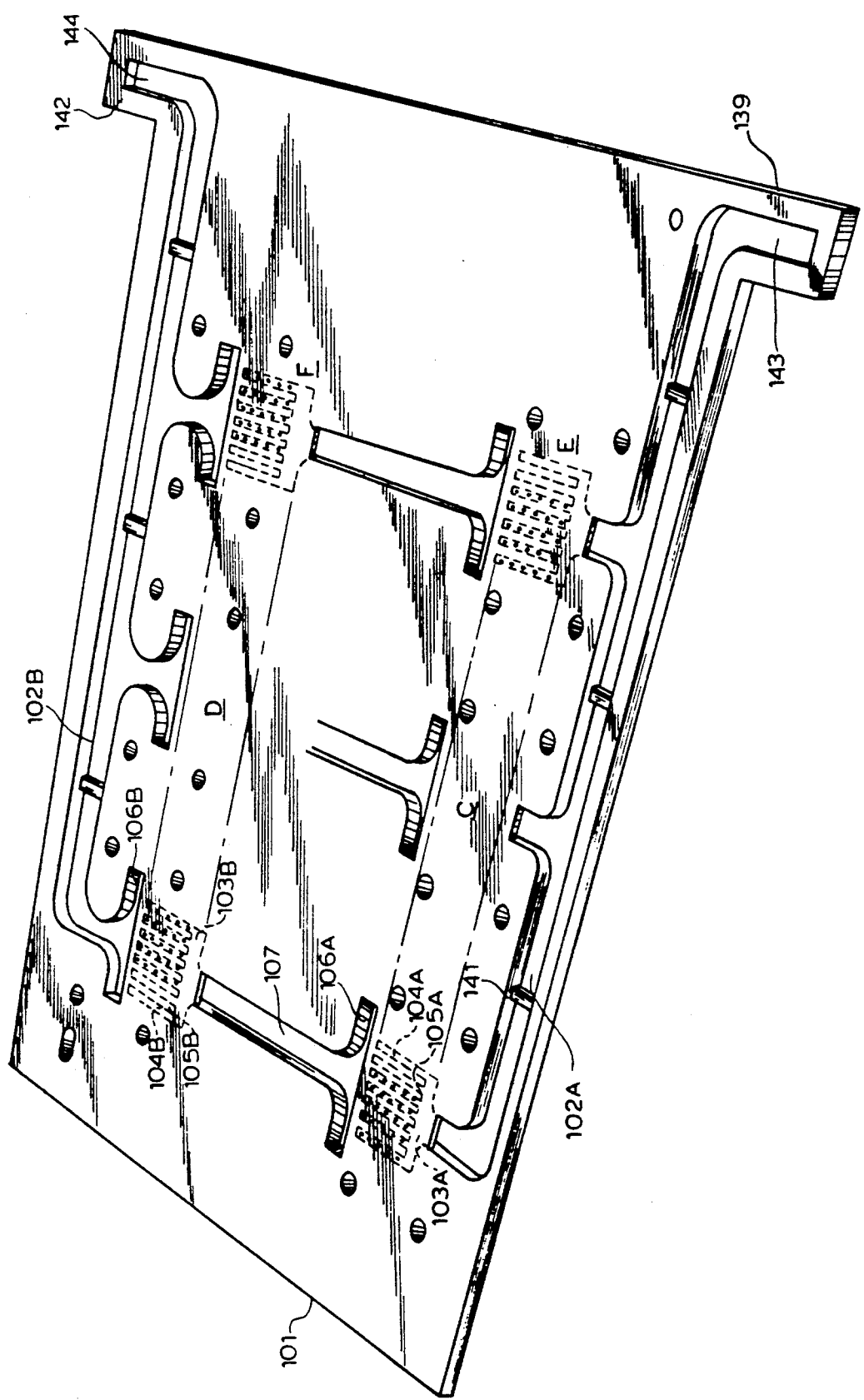
Figure 5G:
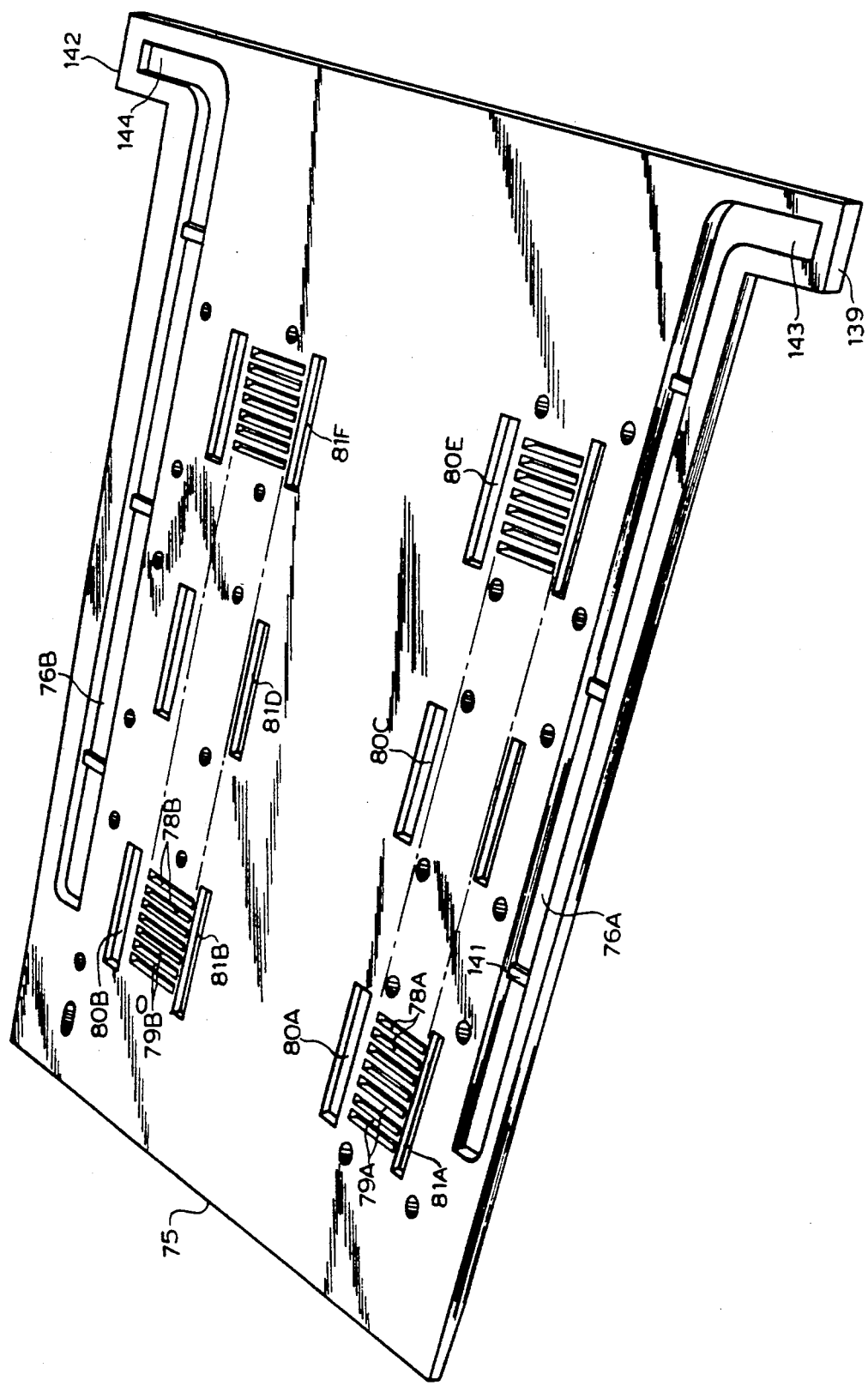

Plate 75, FIG. 5G, is next in the stack, is mounted on top of plate 71 and has fluid path 76A and fluid path 76B extending along opposite edges of plate 75. Fluid paths 76A and 76B may extend entirely through plate 75 with plate 71 acting as a seal for preventing leakage of cooling fluid flowing within channels 76A and 76B. Plate 75 also has a plurality of slots 78A separated by spacers 79A. Slots 78A are formed to be in fluid engagement with pad 73A of plate 71. Slots 78A need not extend entirely through plate 75 but may be depressions having a plurality of holes to allow fluid to flow through plate 75 from plate 82 to pad 73A. In fact, any of the plates may be so formed if extra rigidity is needed. Spacers 79A of plate 75 overlie mesas 74A in pad 73A. Channel 80A extends all of the way through plate 75 and fluidly engages pad 73A. Channel 80A acts as a return path for fluid which has been supplied to pad 73A. Channel 81A extends through plate 75 for allowing better distribution of cooling fluid through pad 73A. Plate 75 has similar areas B, C, D, E and F.

Next in the stack is plate 82, FIG. 5F, which has channels 83A and 83B extending therethrough for cooperation with channels 76A and 76B respectively in plate 75. Plate 82 also has a plurality of slots 84A for cooperating with slots 78A of plate 75. Slots 84A, extending all of the way through plate 82, are separated by spacers 85A which cooperate with spacers 79A of plate 75. Finally, plate 82 has channel 86A extending therethrough for cooperating with channel 80A of plate 75. Plate 82 has similar areas B, C, D, E and F.

Next plate 87, FIG. 5E, has channels 88A and 88B extending therethrough for fluid communication with respective channels 83A and 83B of plate 82. In addition, plate 87 has a pad 89A formed in, but not all of the way through, plate 87. On pad 89A are mesas 90A separating finger like depressions 91A, all of which are in fluid communication with each other and with channel 88A. Within depressions 91A of pad 89A are holes extending the rest of the way through plate 87 so that fluid entering pad 89A can flow into depressions 91A and then down through plate 87, through slots 84A in plate 82, slots 78A in plate 75, and to cooling pad 73A before it is returned up through slot 80A in plate 75, slot 86A in plate 82, and slot 92A in plate 87. Slot 92A communicates with channel 93 which then communicates with pad 89B having depressions 91B separated by mesas 90B. There are holes extending the rest of the way through plate 87 so that fluid being returned up through slot 92A can flow through channel 93 into pad 89B and then down through the holes within depressions 91B to the corresponding B areas of plates 82, 75, and 71 and then up through slots 80B of plate 75, slot 86B of plate 82, and into slot 92B of plate 87. Slot 92B is in fluid communication with channel 88B. Plate 86 has similar areas C, D, E and F.

Plate 101, FIG. 5D, is the next plate in the stack and is the mirror image of plate 87. Thus, channel 102A extending through plate 101 cooperates with channel 88A extending through plate 87. Channel 102A communicates with pad 103A, shown in phantom because it is beneath the surface of plate 101 shown in FIG. 5D, having depressions 104A separated by mesas 105A. As illustrated, depressions 104A do not extend all of the way through plate 101 except for holes extending the rest of the way through the plate 101. Thus, fluid entering pad 103A flows into depressions 104A and then up to corresponding slots 113A in plate 111A (FIG. 5C). Fluid returning to plate 101 enters slot 106A extending therethrough which communicates with channel 107. Channel 107 communicates with pad 103B having depressions 104B separated by mesas 105B. Holes in the depressions 104B extend the rest of the way through plate 101 so that fluid can flow from channel 107 into pad 104B and then up through plates 111 and 121 to cooling pad 132B on plate 131 and then returns through a series of slots to slot 106B which is in communication with channel 102B extending through plate 101. Four additional such areas C, D, E, and F are provided in plate 101.

Next plate 111, FIG. 5C, has channel 112A in communication with channel 102A of plate 101, and slots 113A which cooperate with the holes through depressions 104A of plate 101. Slots 113A are separated by spacers 114A which overlie mesas 105A of plate 101. Channel 115A is in communication with channel 106A of plate 101. Plate 111 has similar areas B, C, D, E and F.

Plate 121, FIG. 5B, the next plate in the stack, has channel 122A in fluid communication with channel 112A of plate 111, and has slots 123A in fluid communication with slots 113A of plate 111. Furthermore, return slot 124A in plate 121 is in communication with slot 115A of plate 111. Plate 121 also has a further slot 125A which cooperates with electrical component cooling pad 132A in final plate 131. Plate 121 has similar areas B, C, D, E, and F.

As illustrated, pad 132A is a depression in the underside surface of plate 131 and does not extend all of the way therethrough. Mesas 133A are provided with pad 132A to help the circulation of fluid and to provide additional support for the electrical component cooling pad provided on the surface of plate 131 away from plate 121, i.e. the top surface as shown in FIG. 5A. Slot 125A of plate 121 cooperates with pad 132A of plate 131 to help fluid circulating therein. Plate 131 has similar cooling pads B, C, D, E and F.

As indicated above, these plates can be etched or stamped for providing the various regions A-F as shown. They may be stacked together in the order illustrated and then braised for providing a substantially unitary structure sealed from fluid leakage. Supports 141 may be provided in the various channels of the plates to aid in the assembly process. Supports 141 are thin enough that they will evaporate during the braising process. Each of the plates is also provided with flanges 139 and 142. Flanges 139 and 142 of some of the plates have corresponding channels 143 and 144 such that channels 143 communicate with channels 76A, 83A, 88A, 102A, 112A, and 122A, whereas channels 144 communicate with channels 76B, 83B, 88B, 102B, 112B, and 122B.

Channels 143 communicate with tube connector 14 through its associated manifold 12 and channels 144 communicate with connector 15 through connector manifold 13.

Accordingly, fluid entering connector 14 for circulation through cooling rack 10 flows through manifold 12, through channels 143 and through channels 76A, 83A, 88A, 102A, 112A, and 122A to areas A, C, and E in the plate stack. Using area A as an example, fluid flowing into the area established by pads 89A and 103A will split, part of the fluid going to plates 71, 75, and 82, and part going to plates 111, 121, 131. The cooling fluid cools pads 73A and 132A and returns through slots 80A, 86A, 92A, 124A, 115A, and 106A to the channel formed by channels 93 and 107. Fluid from channels 93 and 107 then enters the area formed by pads 89B and 103B where it again divides, part of it flowing to electrical component cooling pad 73B on plate 72 and part of it flowing to electrical component cooling pad 132B on plate 131. Fluid flows back from pad 73B through slots 80B, 86B, and 92B and from pad 132B through slots 124B, 115B, and 106B where it is collected. The fluid then flows through the channel formed by channels 76B, 83B, 88B, 102B, 112B, and 122B. Fluid will exit the rack through channels 144, through manifold 13 and out through connector 15.

In this manner, the various electrical component cooling pad areas A-F on plates 71 and 131 will be cooled by the cooling fluid circulating through cooling support 11.

FIG. 6 shows a board support 141 which can be used as one of the board supports 18 and 19. Board support 141 has openings 142 extending therethrough. These openings in board 141 cooperate with the electrical component cooling pads on plates 71 and 131 of FIG. 5. Board 141 has a plurality of bus receiving grooves 146, 147, 148 and 149 for receiving power bus bars such as bus bars 161 and 162 shown in FIGS. 9 and 10. These bus bars both have an end with a hole extending therethrough. When the bus bars shown in FIGS. 9 and 10 are mounted to board support 141, the ends of bus bars 161 and 162 can be bent up so that power connectors 26, as shown in FIG. 1, can be attached thereto.

Circuit board 151 can be used for one of the circuit boards 20, the other of which may be identical. Circuit board 151 is shown in FIG. 7 and has openings 152 which cooperates with openings 142 on support board 141 such that the electrical components, such as the ones shown in FIG. 2, can be mounted through openings 142 and 152 directly to the appropriate electrical component cooling pads on plates 71 and 131. Printed circuit board 151 also carries electrical connector 21 connected to the various circuit paths which are placed on the surface of printed circuit board 151.

FIG. 8 shows a further bus bar carrier which cooperates with board support 141.

Accordingly, devices 23 are bolted or otherwise fastened through appropriate holes which extend through the plates shown in FIG. 5 which make up cooling support 11. There are a set of these holes for each of the cooling pad areas on plates 71 and 131. The electrical devices are then plugged into and soldered to circuit boards 20. The tabs of the electrical components make contact with appropriate power bus bars running along circuit board supports 18 and 19 and are soldered thereto. Thus, first board support 18 carrying first printed circuit board 20 is attached to one of the plates 71, 131, using suitable fasteners 17 and second board support 19 supporting a second printed circuit board is attached to the other of the two plates 71, 131 by the fastening means 17. Once the board supports carrying printed circuit boards are fastened to plate stack 11, electronic devices 23 can then be electrically connected to the printed circuit board and to the power bus bars. The cooling rack can then be inserted into chassis 40.

Figure 11:
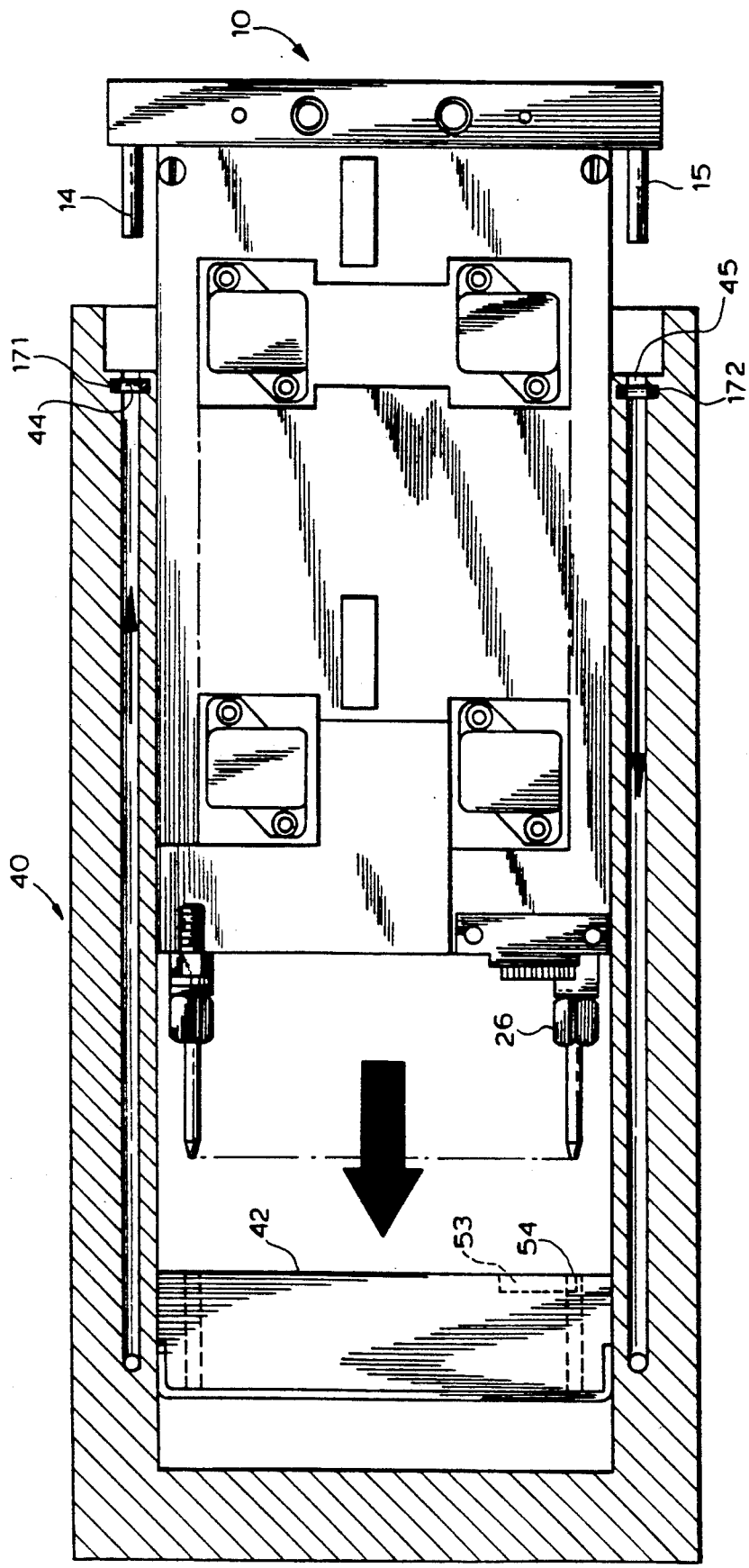

FIG. 11 shows the insertion process in more detail. As rack 10 is inserted into chassis 40, rack fluid connector 14 is inserted into chassis fluid connector 44 and rack fluid connector 15 is inserted into a chassis fluid connector 45. "O" rings 171 and 172 are provided within respective chassis connectors 44 and 45 in order to provide a fluid-tight seal between connectors 44 and 45 and their respective rack connectors 14 and 15. The electrical connectors carried by rack 10 engage their corresponding electrical connectors on mother board 42 of chassis 40 generally in unison with the engagement of rack connectors 14 and 15 to chassis fluid connectors 44 and 45. As shown in FIG. 11, pin connector 26 on rack 10 is inserted into receptacle connector 54 on mother board 42 as rack 10 is inserted into chassis 40.

A plurality of chassis fluid connectors 44 and 45 are provided in the chassis so that the chassis can receive a plurality of racks 10 and provide cooling fluid thereto. If fewer racks 10 are inserted into chassis 40 than there are connectors 44 and 45, plugs can be inserted into the unused connectors 44 and 45 to prevent leakage therefrom. Alternatively, each connector 44 and 45 can be provided with a valve which is opened if the specific connector 44, 45 receives a rack 10 and is left closed if they do not receive a rack 10. In another alternative, valve gates can be provided within connectors 44 and 45 which are automatically opened by rack connectors 14 and 15 if a rack 10 is inserted into corresponding chassis fluid connectors 44 and 45. If a specific set of connectors 44, 45 do not receive a rack 10, the gates act as a check valve for preventing fluid from exiting manifolds 42 and 43 through the unused chassis connectors 44, 45.

When rack 10 is inserted into chassis 40, fluid can then flow from chassis inlet 46 through manifold 42 to chassis fluid connector 44. Cooling fluid then flows into the corresponding rack connector 14 and then through the channels established as previously described with respect to FIGS. 5A–5H to the various cooling pads and then back out through the appropriate rack channels in the plate stack to rack fluid outlet 15. Fluid then flow into chassis connector 45, through manifold 43, and back to chassis outlet 48.

What is claimed is:

1. A cooling rack for insertion into a chassis, said cooling rack comprising:
    cooling plate means having at least one electrical component cooling pad and a rack manifold for circulating cooling fluid to said at least one electrical component cooling pad;
    a board support mounted on said cooling plate means, said board support having an opening coinciding with said at least one electrical component cooling pad and having a bus bar;
    a printed circuit board mounted on said board support, said printed circuit board having circuit paths and an opening coinciding with said at least one electrical component cooling pad and with said opening in said board support;
    an electrical component mounted in cooling relationship with said at least one electrical component cooling pad through said openings in said printed circuit board and in said board support and electrically connected to said circuit paths and to said bus bar;
    rack electrical connectors connected to said circuit paths and to said bus bar;
    rack inlet fluid connector means connected to said rack manifold for receiving cooling fluid and for supplying said cooling fluid to said rack manifold for cooling said at least one electrical component cooling pad; and,
    rack outlet fluid connector means connected to said rack manifold for receiving cooling fluid from said rack manifold after said cooling fluid has cooled said at least one electrical component cooling pad,
    wherein said rack electrical connectors, said rack inlet fluid connector means, and said rack outlet fluid connector means are arranged so that, as said cooling rack is inserted into said chassis, said rack electrical connector and said rack inlet fluid connector means and said rack outlet fluid connector means mate generally in unison with corresponding connectors on said chassis.

2. The cooling rack of claim 1 wherein said cooling support means comprises first and second opposing surfaces each having at least one electrical component cooling pad, said rack manifold directing cooling fluid to said at least one electrical component cooling pad of each of said first and second surfaces.

3. The cooling rack of claim 2 wherein said printed circuit board, board support, and said electrical component are mounted to said first surface, said cooling rack further comprising a second board support mounted on said second surface, said second board support having a second opening coinciding with said at least one electrical component cooling pad on said second surface and having a second bus bar, a second printed circuit board mounted to said second board support, said second printed circuit board having second circuit paths and a second opening coinciding with said at least one electrical component cooling pad on said second surface and said second opening in said second board support, and a second electrical component mounted to said at least one electrical component cooling pad on said second surface through said second openings in said second printed circuit board and in said second board support, said second electrical component being electrically connected to said second printed circuit paths and to said second bus bar.

4. The cooling rack of claim 3 wherein said first surface comprises a first plate having one of said at least one electrical component cooling pad thereon, said second surface comprises a second plate having one of said at least one electrical component cooling pad thereon, and said rack manifold comprises at least a third plate for directing cooling fluid to and away from said pads.

5. The cooling rack of claim 4 wherein said rack manifold comprises a plurality of plates sandwiched between said first and second plates, said first and second plates being arranged for confining said cooling fluid therebetween, said electrical component cooling pads for receiving said electrical components on a side away from said plurality of plates.

6. The cooling rack of claim 5 wherein said plates are divided equally into a first set of plates and a second set of plates, said first and second sets being arranged such that cooling fluid entering said cooling rack is split, part of said cooling fluid flowing through said first set of plates to said electrical component cooling pad on said first surface and part of said cooling flowing through said second set of plates to said electrical component cooling pad on said second surface.

7. A cooling rack for insertion into a chassis, the cooling rack comprising;
   a plurality of electronic components to be cooled;
   fluid receiving means for receiving cooling fluid from the chassis;
   fluid returning means for returning cooling fluid to the chassis; and
   supporting means for supporting the fluid receiving means and the fluid returning means so that, when the cooling rack is inserted into the chassis, the fluid receiving means is position to receive cooling fluid from the chassis and the fluid returning means is positioned to return fluid to the chassis, wherein the supporting means includes a first plate having first and second sides, the supporting means having a plurality of cooling pads, each of the electronic components being mounted on the first side of the first plate in cooling relation to a corresponding one of the plurality of cooling pads, and wherein the supporting means further includes manifold means, connected to the fluid receiving means and to the fluid returning means, for receiving cooling fluid from the fluid receiving means, for directing cooling fluid perpendicularly against each of the plurality of cooling pads so as to cool the plurality of electrical components and for returning the cooling fluid from the plurality of cooling pads to the fluid returning means, the manifold means being mounted on the second side of the first plate.

8. The cooling rack of claim 7 wherein the supporting means comprises a second plate having first and second sides, wherein the manifold means is sandwiched between the first and second plates and wherein the manifold means conducts cooling fluid to the second side of the second plate for cooling an electrical component mounted on the first side of the second plate.

9. The cooling rack of claim 8 wherein the manifold means comprises a plurality of plates sandwiched between the first and second plates, the first and second plates being arranged for confining the cooling fluid therebetween, the plurality of plates forming fluid conducting channels for directing cooling fluid against the second side of the first and second plates.

10. The cooling rack of claim 9 wherein the plurality of plates are divided equally into a first set of plates and a second set of plates, the first and second set of plates being arranged such that part of the cooling fluid received by the fluid receiving means is directed against the second side of the first plate and part of the cooling fluid received by the fluid receiving means is directed against the second side of the second plate.

11. An arrangement for cooling electrical components comprising:
    a chassis including
       chassis electrical connectors,
       a first set of chassis fluid connectors,
       a second set of chassis fluid connectors,
       a chassis fluid inlet for receiving cooling fluid,
       a chassis fluid outlet for discharging cooling fluid for recooling,
       a first chassis manifold for connecting the chassis fluid inlet to the first set of chassis fluid connectors, and
       a second chassis manifold for connecting the chassis fluid outlet to the second set of chassis fluid connectors; and
    a plurality of cooling racks, each cooling rack including
       an electronic component,
       a first rack fluid connector in fluid communication with one of the first set of chassis fluid connectors for receiving cooling fluid therefrom,
       a second rack fluid connector in fluid communication with one of the second set of chassis fluid connectors for returning cooling fluid thereto,
       supporting means for supporting the first and second rack fluid connectors, the supporting means including a first plate having first and second sides, the electronic component being mounted directly on the first side of the first plate, wherein the supporting means further includes channel means, connected to the first and second rack fluid connectors, for directing cooling fluid from the first rack fluid connector to the second side of the first plate so as to cool the electronic component mounted directly thereon and for returning cooling fluid from the second side of the first plate to the second rack fluid connector, the channel means being mounted on the second side of the first plate.

12. The cooling rack of claim 11 wherein the channel means comprises fluid conducting channels for directing cooling fluid perpendicularly against the second side of the first plate.

13. The cooling rack of claim 12 wherein the supporting means comprises a second plate having first and second sides, wherein the channel means is sandwiched between the first and second plates and wherein the fluid conducting channels conduct fluid perpendicularly against the second side of the second plate for cooling an electrical component mounted on the first side of the second plate.

14. The cooling rack of claim 13 wherein the channel means comprises a plurality of plates sandwiched between the first and second plates, the first and second plates being arranged for confining the cooling fluid therebetween, the plurality of plates forming the fluid conducting channels for directing cooling fluid perpendicularly against the second sides of the first and second plates.

15. The cooling rack of claim 14 wherein the plurality of plates are divided equally into a first set of plates and a second set of plates, the first and second sets of plates being arranged such that part of the cooling fluid received by the first rack fluid connector is directed against the second side of the first plate and part of the cooling fluid received by the first rack fluid connector is directed against the second side of the second plate.

16. The cooling rack of claim 11 wherein the supporting means comprises a second plate having first and second sides, wherein the channel means is sandwiched between the first and second plates and wherein the channel means conducts cooling fluid to the second side of the second plate for cooling an electrical component mounted on the first side of the second plate.

17. The cooling rack of claim 16 wherein the channel means comprises a plurality of plates sandwiched between the first and second plates, the first and second plates being arranged for confining the cooling fluid therebetween, the plurality of plates forming fluid conducting channels for directing cooling fluid to the second sides of the first and second plates.

18. The cooling rack of claim 17 wherein the plurality of plates are divided equally into a first set of plates and a second set of plates, the first and second set of plates being arranged such that part of the cooling fluid received by the first rack fluid connector is directed against the second side of the first plate and part of the cooling fluid received by the first rack fluid connector is directed against the second side of the second plate.

* * * * *